United States Patent
Keller et al.

(10) Patent No.: US 11,955,334 B2
(45) Date of Patent: Apr. 9, 2024

(54) VAPOR PHASE EPITAXY METHOD

(71) Applicant: AZUR SPACE SOLAR POWER GMBH, Heilbronn (DE)

(72) Inventors: Gregor Keller, Heilbronn (DE); Clemens Waechter, Lauffen am Neckar (DE); Thorsten Wierzkowski, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 207 days.

(21) Appl. No.: 17/129,744

(22) Filed: Dec. 21, 2020

(65) Prior Publication Data
US 2021/0193464 A1 Jun. 24, 2021

(30) Foreign Application Priority Data

Dec. 20, 2019 (DE) ...................... 10 2019 008 931.6

(51) Int. Cl.
*H01L 21/02* (2006.01)
*C23C 16/30* (2006.01)
(Continued)

(52) U.S. Cl.
CPC ...... *H01L 21/02579* (2013.01); *C23C 16/301* (2013.01); *C30B 25/14* (2013.01);
(Continued)

(58) Field of Classification Search
CPC .............. H01L 29/0615; H01L 29/06; H01L 21/02576; H01L 21/02546;
(Continued)

(56) References Cited

U.S. PATENT DOCUMENTS 3,224,913 A * 12/1965 Ruehrwein ....... H01L 21/02549
438/936
4,045,257 A * 8/1977 Butter ............... H01L 21/02581
438/45
(Continued)

FOREIGN PATENT DOCUMENTS

DE 102004034103 A1 4/2005
EP 2221856 A1 8/2010
JP 2003133320 A * 5/2003

OTHER PUBLICATIONS

Sotoodeh, M & Khalid, Ata & Rezazadeh, AA. (2000). "Empirical low-field mobility model for III-V compounds applicable in device simulation codes". Journal of Applied Physics. 87. 2890-2900. 10.1063/1.372274; hereafter Sotoodeh).*

(Continued)

*Primary Examiner* — Yara B Green
*Assistant Examiner* — Fakeha Sehar
(74) *Attorney, Agent, or Firm* — Muncy, Geissler, Olds & Lowe, P.C.

(57) ABSTRACT

A vapor phase epitaxy method of growing a III-V layer with a doping profile that changes from a p-doping to an n-doping on a surface of a substrate or a preceding layer from the vapor phase from an epitaxial gas flow, at least one first precursor for an element of main group III, and at least one second precursor for an element of main group V. When a first growth height is reached, a first initial doping level is set by means of a ratio of a first mass flow of the first precursor to a second mass flow of the second precursor in the epitaxial gas flow, and subsequently, by stepwise or continuously changing the ratio of the first mass flow to the second mass flow and by stepwise or continuously increasing a mass flow of a third precursor for an n-type dopant in the epitaxial gas flow.

24 Claims, 1 Drawing Sheet

(51) Int. Cl.
*C30B 25/14* (2006.01)
*C30B 29/42* (2006.01)
*H01L 29/06* (2006.01)

(52) U.S. Cl.
CPC ........ *C30B 29/42* (2013.01); *H01L 21/02546* (2013.01); *H01L 21/02576* (2013.01); *H01L 21/0262* (2013.01); *H01L 29/06* (2013.01)

(58) Field of Classification Search
CPC ........... H01L 21/02579; H01L 21/0262; C23C 16/301; C30B 25/14; C30B 29/42
See application file for complete search history.

(56) References Cited

U.S. PATENT DOCUMENTS

| | | | |
|---|---|---|---|
| 6,163,037 A * | 12/2000 | Matsumoto | H01L 33/02 257/97 |
| 7,033,921 B2 | 4/2006 | Jurgensen | |
| 7,732,308 B2 | 6/2010 | Schumacher et al. | |
| 8,652,948 B2 | 2/2014 | Horie et al. | |
| 2002/0028565 A1* | 3/2002 | Nikolaev | C30B 29/406 257/E31.02 |
| 2003/0213973 A1* | 11/2003 | Yoshioka | H01L 29/66318 257/E29.189 |
| 2014/0120703 A1* | 5/2014 | Iwami | H01L 21/02581 438/478 |
| 2018/0138320 A1* | 5/2018 | Dudek | H01L 29/0657 |
| 2019/0272994 A1 | 9/2019 | Jain et al. | |
| 2019/0280613 A1* | 9/2019 | Fujii | H01L 29/41716 |

OTHER PUBLICATIONS

Singh, R., Baliga, B.J. (1998)." P-I-N Diode. In: Cryogenic Operation of Silicon Power Devices". The Springer International Series in Engineering and Computer Science. Springer, Boston, MA. https://doi.org/10.1007/978-1-4615-5751-7_4; hereafter, Singh).*

G. Lioliou, M. D. C. Whitaker, A. M. Barnett; High temperature GaAs X-ray detectors. Journal of Applied Physics Dec. 28, 2017; 122 (24): 244506. https://doi.org/10.1063/1.5005878.*

Modak et al. (P. Modak, M. Kumar Hudait, S. Hardikar and S. B. Krupanidhi, "Structural and electrical properties of undoped GaAs grown by MOCVD," 1996 Conference on Optoelectronic and Microelectronic Materials and Devices. Proceedings, 1996, pp. 353-356, doi: 10.1109/COMMAD.1996.610143; hereafter Modak).*

Olsen, Lawrence, Investigation of high efficiency monolithic multiband solar cells, Final Report, University of Washington, 1991.*

Mantu Kumar Hudait, S.B Krupanidhi, Correlation of compensation in Si-doped GaAs between electrical and optical methods, Solid State Communications, vol. 108, Issue 7, 1998, pp. 457-461, ISSN 0038-1098, https://doi.org/10.1016/S0038-1098(98)00386-X.*

Singh et al. (Singh, R., Baliga, B.J. (1998). P-I-N Diode. In: Cryogenic Operation of Silicon Power Devices. The Springer International Series in Engineering and Computer Science. Springer, Boston, MA. https://doi.org/10.1007/978-1-4615-5751-7_4; hereafter, Singh).*

C. Wang, L. Su and L. Zhang, "A 10kV 4H-SiC PIN Diode with Gradual Doping Buffer Layers and p+ Adjusting Regions at Cathode," 2018 1st Workshop on Wide Bandgap Power Devices and Applications in Asia (WiPDA Asia), 2018, pp. 221-224, doi: 10.1109/WiPDAAsia.2018.8734627.*

Sotoodeh, M & Khalid, Ata & Rezazadeh, AA. (2000). Empirical low-field mobility model for III-V compounds applicable in device simulation codes. Journal of Applied Physics. 87. 2890-2900. 10.1063/1.372274.*

Glew R. W. et al.: "GaAlAs/GaAs p-n-p Heterojunction Bipolar Transistors Grown by MOCVD", Journal of Crystal Growth vol. 68, 1984, pp. 450-452.

Schulte K. et al.: "Controlled formation of GaAs pn junctions during hydride vapor phase epitaxy of GaAs", Journal of Crystal Growth, vol. 352, 2012, pp. 253-257.

S. J. Pearton et al: "Material and Device Properties of 3 Diameter GaAs-on-Si with Buried P-type Layers" Materials Science & Engineering, vol. 3, No. 3, Aug. 1989, pp. 293-298, XP000032864, ISSN: 0921-5107.

* cited by examiner

VAPOR PHASE EPITAXY METHOD

This nonprovisional application claims priority under 35 U.S.C. § 119(a) to German Patent Application No. 10 2019 008 931.6, which was filed in Germany on Dec. 20, 2019, and which is herein incorporated by reference.

BACKGROUND OF THE INVENTION

Field of the Invention

The present invention relates to a vapor phase epitaxy method.

Description of the Background Art

Different vapor phase epitaxy systems, e.g., from the company Aixtron, for the epitaxial formation of semiconductor layers are known.

It is a common feature of the systems that the epitaxial layers are deposited or grown from the vapor phase on a substrate brought into a reaction chamber. To this end, the reaction chamber is heated and an epitaxial gas flow is introduced into the reaction chamber.

The composition of the gas flow depends on the type of layer to be grown, wherein typically precursors, such as, e.g., arsine and/or TMGa, supply the elements for the semiconductor layer to be grown and, if necessary, precursors for a dopant are also added for doping the layer. The precursors are fed into the reaction chamber by means of a carrier gas. Mass flow controllers are typically used to control the gas flow composition.

However, it should also be noted that due to the reactor history, other undesirable elements from previous processes may also still be present in the reaction chamber. This can be problematic especially for the formation of low-doped layers.

SUMMARY OF THE INVENTION

It is therefore an object of the present invention to provide a method that refines the state of the art.

According to an exemplary embodiment of the invention, a vapor phase epitaxy method is provided with the method step of growing a III-V layer with a doping profile that changes from p-doping to n-doping on a surface of a substrate or a preceding layer.

In a reaction chamber, the III-V layer is grown from the vapor phase from an epitaxial gas flow.

The epitaxial gas flow has a carrier gas and at least one first precursor for an element from main group III and at least one second precursor for an element from main group V.

In addition, when a first growth height is reached, a first initial doping level is set by means of a ratio of a first mass flow of the first precursor to a second mass flow of the second precursor in the epitaxial gas flow.

Subsequently, by gradually or continuously changing the ratio of the first mass flow to the second mass flow and by gradually or continuously increasing a mass flow of a third precursor for an n-type dopant in the epitaxial gas flow, a doping of the III-V layer over a junction region layer with a growth height of at least 10 µm is changed until a target n-doping level is reached.

It is understood that a III-V layer has at least one component or also multiple components of main group III, e.g., aluminum or gallium, and at least one component or multiple components of main group V, e.g., indium or arsenic or phosphorus.

Molecules that serve as the starting product for epitaxial growth are called precursors. A precursor is accordingly a molecule consisting of an element to be grown, e.g., an element of main group III or V or a dopant, and of at least one further element.

In the case of organometallic precursors in particular, e.g., TMGa, a further element is carbon, which is released during growth and thus also acts as a dopant.

Doping a layer by means of the carbon of an organometallic precursor is referred to as autodoping, whereas adding a precursor for a dopant to the epitaxial gas flow is referred to as direct doping.

In the case of autodoping in particular, the height and type of doping of a III-V layer depends on the quantity ratio between the main group III element or elements and the main group V element or elements in the reaction chamber.

Depending on the type and size of the vapor phase system used, the V/III quantity ratio within the reaction chamber fluctuates; i.e., the incoming gas flow has different V/III quantity ratios at different locations. Such fluctuations can occur in the area of a single substrate and/or across multiple substrates.

It is understood that changing the mass flow or changing the ratio of two different mass flows can be equivalent to changing a corresponding partial pressure or partial pressure ratio or is basically equivalent to each quantity control/quantity change.

It is also understood that the setting of the stated doping levels can occur during the growth or that the growth is continuous and the mass flows are changed during the growth or deposition, wherein a stepwise change in a mass flow or a mass flow ratio also leads to a corresponding stepwise, e.g., step-like, change in the doping or a continuous change in the mass flows leads to a correspondingly continuous, e.g., ramp-like, change in the doping in the grown layer.

In this regard, the individual steps, therefore changing the setting the first initial doping level up to the target doping level, either follow one another directly in time or they take place delayed in time, wherein with a time delay and without further changes to the epitaxial gas flow, a layer with constant doping still forms accordingly.

First, the first initial doping level is set, wherein the doping is set by autodoping, therefore, via the V/III ratio. No further precursor for a p-type dopant is added to the epitaxial gas flow.

By changing the V/III ratio and/or the mass flow of the third precursor during the growth of the junction region layer, a reproducible profile can be achieved in the region of the p-n junction. An undesirable formation of serial multiple p-n junctions on the semiconductor wafers can be reliably suppressed, as can the formation of local differences in the dopant profiles.

A further advantage is that cross-contamination, for example, from the filling of the reactor chamber from previous epitaxial phases, can be reliably and effectively compensated for, and layers with low dopings below $5 \cdot 10^{15}$ cm$^{-3}$ and in particular p-n junctions can be reliably produced starting from an n-doping.

Starting from a constant V/III ratio during the growth of the junction region layer of at least 10 µm, the previous blocking voltages, fluctuating strongly on the semiconductor wafers, with differences of more than 20 V or more than 100 V can be reduced.

Alternatively, the epitaxial gas flow has an optionally small amount of a precursor for a p-type dopant, which is taken into account in the setting of the doping via the V/III ratio.

The p-doping of the preceding region of the III-V layer is possibly higher. For example, a pregrown layer or the substrate has a p-doping with a decreasing profile, wherein the first initial doping level is reached at the first growth height.

The preceding layer or the substrate already has a doping corresponding to the first initial doping level, so that the setting when the first growth height is reached corresponds to a retention of the settings.

The pregrown layer or the substrate has a higher p-doping, wherein the p-doping is reduced abruptly, stepwise, or continuously to the first initial level up to the first growth height.

It is also understood that the epitaxial gas flow can already have a possibly low mass flow of the third precursor also when the first initial doping level is set, wherein the presence of the n-type dopant is compensated accordingly by means of the V/III ratio and/or the mass flow of the further precursor.

The subsequent ramp-like or step-like change in the doping over the junction region layer takes place by changing the ratio of the first mass flow to the second mass flow and by increasing the mass flow of the third precursor, e.g., silane.

It is understood that the change in the ratio of the first to the second mass flow and the increase in the mass flow of the third precursor take place in parallel, i.e., simultaneously, and/or stepwise alternately or also completely one after another.

For example, $H_2$ or $N_2$ is suitable as a carrier gas for the epitaxial gas flow.

Due to local differences in the V/III ratio and/or background doping, an abrupt p-n junction, therefore, a change in the doping from p to n without intermediate steps and over a very low growth height, e.g., a few nanometers at most, especially with low dopings can lead to very different blocking voltages across individual semiconductor wafers and/or multiple semiconductor wafers.

Stated differently, fluctuations in the V/III ratio across the semiconductor wafer result in different local dopings and have a particularly strong effect especially at low dopings.

An advantage of the method is that the vapor phase epitaxy method can be carried out using a low flow of the second precursor for group V. If arsine or TMGa is used in particular for the second precursor, the production costs can be significantly reduced by means of a low flow of the second precursor and the environmental friendliness of the production process can be greatly increased.

By the stepwise or continuous changing of the doping across the thickness of a junction region layer with a constant or almost constant V/III ratio of the mass flows, in contrast, a profile of the p-n junction reproducible across the entire reaction chamber is achieved on the semiconductor wafer.

The differences in the incoming gas flow only have an effect on the absolute growth depth of the junction, wherein the differences in the absolute growth depth have a smaller influence on the blocking voltages achieved than a non-reproducible doping profile of the p-n junction.

By means of a mass flow controller for the mass flow of the third precursor as well as mass flow controllers for the mass flows of the first and second precursors, the step-like or ramp-like junction region of the invention can be controlled or implemented in a simple and reliable manner.

A further advantage of the invention is thus that high dielectric strengths of the p-n junction above 200 V can be reliably achieved in a simple and reproducible manner without special requirements for the vapor phase epitaxy system used.

The first initial doping level can be an initial p-doping level and is at most $5 \cdot 10^{16}$ cm$^{-3}$ or at most $1 \cdot 10^{16}$ cm$^{-3}$ or at most $1 \cdot 10^{15}$ cm$^{-3}$ or at most $5 \cdot 10^{14}$ cm$^{-3}$. Alternatively, the first initial doping level is an initial n-doping level and is at most $1 \cdot 10^{15}$ cm$^{-3}$ or at most $5 \cdot 10^{-4}$ cm$^{-3}$ or at most $1 \cdot 10^{14}$ cm$^{-3}$. A low p-doping or even a very low n-doping level is thus selected as the starting point for the ramp or step.

The target n-doping level can be at most $5 \cdot 10^{16}$ cm$^{-3}$ or at most $1 \cdot 10^{16}$ cm$^{-3}$ or at most $1 \cdot 10^{15}$ cm$^{-3}$ or at most $5 \cdot 10^{14}$ cm$^{-3}$. The ramp or step thus covers a range of low doping levels.

The growth height of the junction region can be at least 30 μm or at least 60 μm.

The doping over the junction region layer can be changed by at most $1 \cdot 10^{13}$ cm$^{-3}$ over each 5 μm of growth height and/or the doping over the junction region layer is changed in at least four steps, e.g., four stages.

The element of main group III can be gallium, and the element of main group V is arsenic, and/or the third precursor is monosilane.

The first initial doping level can be set starting from a second initial p-doping level by an abrupt change in the ratio of the first mass flow to the second mass flow.

The doping is thus abruptly changed into the junction region. The second initial p-doping level according to one refinement is at most $5 \cdot 10^{16}$ cm$^{-3}$ or at most $1 \cdot 10^{16}$ cm$^{-3}$.

The doping of III-V layer in a layer region, preceding the first growth height, can be reduced by continuously and/or stepwise changing the ratio of the first mass flow to the second mass flow from a starting p-doping level of at least $5 \cdot 10^{16}$ cm$^{-3}$ or at least $1 \cdot 10^{17}$ cm$^{-3}$ to the first initial doping level or to a second initial doping level.

A layer region, preceding the first growth height, can have a constant p-doping level, wherein the p-doping level either corresponds to the first initial doping level or the doping is abruptly reduced from the p-doping level to the first initial doping level when the first growth height is reached.

After the target n-doping level has been reached, growth is continued further over a growth height of at least 10 μm with the settings for the target n-doping level.

Also, after the target n-doping level has been reached over a growth height, a further target n-doping level is set by abruptly changing the third mass flow and/or by abruptly changing the ratio of the first mass flow to the second mass flow, wherein the further target n-doping level is greater than the target n-doping level.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
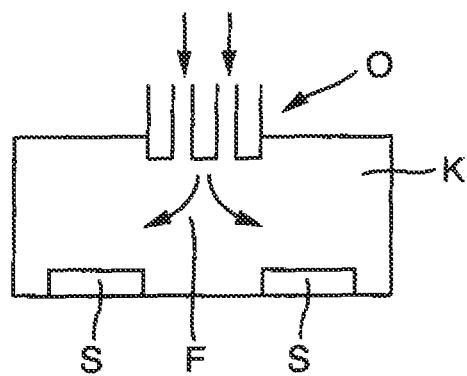
FIG. 1 shows a cross section of substrates arranged in a reaction chamber.

The illustration of FIG. 1 schematically shows a cross section of a reactor chamber K of a vapor phase epitaxy system. Substrates S are arranged on a bottom of reactor chamber K. In addition, reactor chamber K has a gas inlet member O through which epitaxial gas flow F is introduced into reactor chamber K.

The epitaxial gas flow F has a carrier gas, at least one first organometallic precursor for an element of main group III, e.g., TMGa, a second precursor for an element of main group V, e.g., arsine, and at least starting at a first growth height x1, a third precursor for an n-type dopant, e.g., silane.

The gas inlet member O has a plurality of lines ending in reactor chamber K, through which one or more components of epitaxial gas flow F are fed into reactor chamber K.

Figure 2:
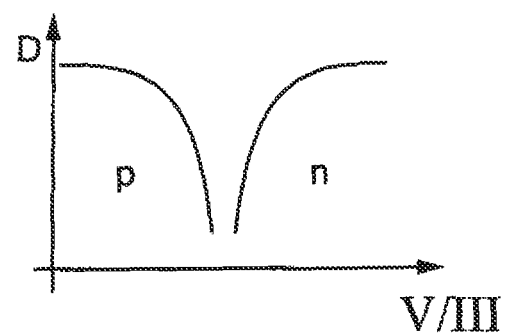
FIG. 2 shows a relationship between a doping and a ratio of elements of main group V to elements of main group III during epitaxial growth.

In the illustration of FIG. 2, the dependence of the doping on a quantity ratio of the elements of main group V and III is shown in a diagram. It becomes clear in particular that not only the level of doping but also the type of doping, therefore, n or p, can be set by the V/III ratio, therefore, the quantity ratio in the gas flow.

On the other hand, it becomes clear that fluctuations in the V/III ratio across a semiconductor wafer or a substrate result in different dopings and such fluctuations have a particularly strong effect, especially at low dopings.

One advantage of this embodiment is that the vapor phase epitaxy method can be carried out using a low flow of the second precursor for group V. If arsine or TMGa is used in particular for the second precursor, the production costs can be significantly reduced by means of a low flow of the second precursor and the environmental friendliness of the production process can be greatly increased.

Figure 3:
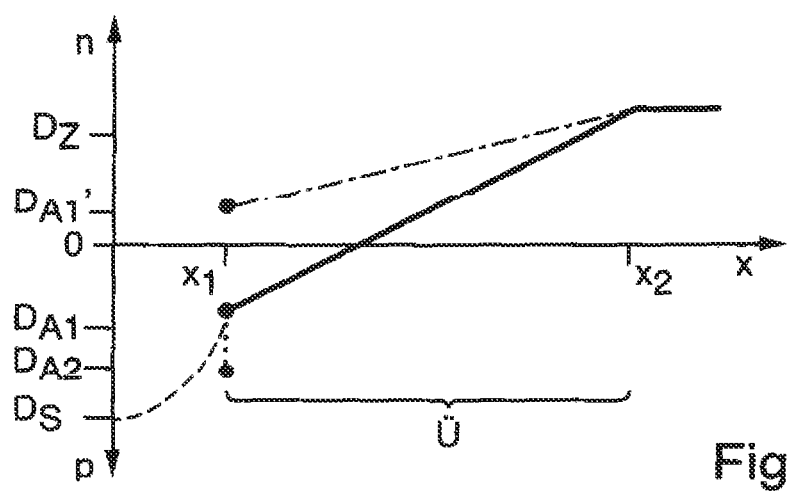
FIG. 3 shows a dopant concentration profile over a grown III-V layer according to a first embodiment of the vapor phase epitaxy method according to the invention.

An exemplary embodiment of the vapor phase epitaxy method of the invention is illustrated in the diagram in FIG. 3 using a profile of doping D versus growth height x.

First or at a first growth height x1, a first p-doped initial doping level DA1 is set solely by means of the ratio of a first mass flow of the first precursor, e.g., TMGa, to a second mass flow of the second precursor, e.g., arsine, in the epitaxial gas flow F, i.e., in particular without the addition of a further mass flow of a further precursor for a p-type dopant, e.g., carbon tetrabromide, to the epitaxial gas flow F. A third mass flow of the third precursor for the n-type dopant is also zero.

Subsequently, the third mass flow of the third precursor, e.g., silane, is added or continuously turned up slowly and continuously over a junction region layer and at the same time the ratio of the first mass flow to the second mass flow is changed until at a layer thickness of $x_2$ a target n-doping level DZ is reached and a ramp-like doping profile has formed between the first initial doping level and the target n-doping level.

It is understood that the junction region layer Ü extends from the first growth height $x_1$ to the second growth height $x_2$.

The epitaxial gas flow F is then not changed further over a further region of the growth height x, so that the doping of the subsequent III-V layer is constant.

Alternatively, a low n-doped level is set as the first initial doping level DA1'. The corresponding doping profile is shown as a dash-dotted line.

According to an refinement, the first initial doping level DA1 is set by an abrupt change in the ratio of the first mass flow to the second mass flow, so that the doping of the III-V layer at or before the first growth height $x_1$ is reduced abruptly from a second initial p-doping level DA2 to the first initial doping level DA1 (shown as a dotted line).

Alternatively, the doping of the III-V layer is reduced from a starting doping level DS to the first growth height continuously to the first initial doping level DA1 (shown as a dashed line).

Figure 4:
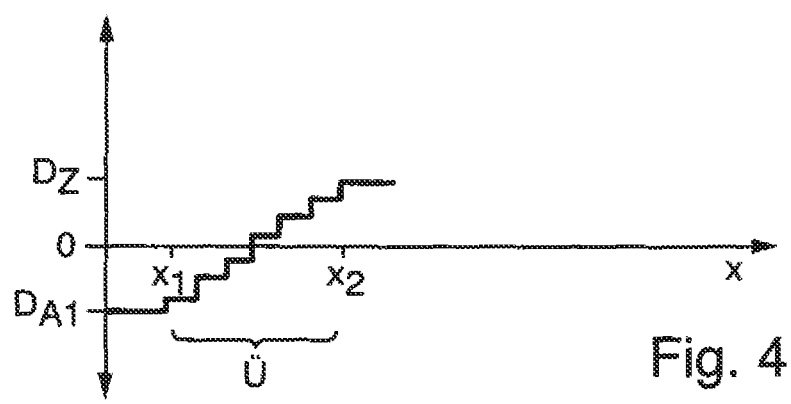
FIG. 4 shows a dopant concentration profile over a grown III-V layer according to a second embodiment of the vapor phase epitaxy method according to the invention.

In the diagram of FIG. 4, a further embodiment of the vapor phase epitaxy method of the invention is illustrated on the basis of the doping profile D, wherein only the differences from the diagram in FIG. 3 will be explained below.

The change in the doping from the initial n-doping level DA1 to the target p-doping level DZ takes place in multiple steps, so that a step-like profile of the doping over the junction region layer Ü is established.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A vapor phase epitaxy method comprising:
   growing a III-V layer on a substrate in a reaction chamber from a vapor phase from an epitaxial gas flow comprising a carrier gas, at least one first precursor for Galium, and at least one second precursor for an Arsine compound;
   during said growing, setting, when a first growth height of the III-V layer is reached, a first initial doping level via a ratio of a first mass flow of the first precursor to a second mass flow of the second precursor in the epitaxial gas flow;
   during said growing, changing, stepwise or continuously, the ratio of the first mass flow of the first precursor to the second mass flow of the second precursor; and
   during said growing, increasing, stepwise or continuously, a mass flow of a third Silane precursor for an n-type dopant in the epitaxial gas flow, doping of the III-V layer with a growth height of at least 10 μm being changed until a target n-doping level of at most $5 \cdot 10^{16}$ cm$^{-3}$ is reached.

2. The vapor phase epitaxy method according to claim 1, wherein the first initial doping level is an initial p-doping level and is at most $5 \cdot 10^{16}$ cm$^{-3}$.

3. The vapor phase epitaxy method according to claim 1, wherein the first initial doping level is an initial n-doping level and is at most $1 \cdot 10^{15}$ cm$^{-3}$.

4. The vapor phase epitaxy method according to claim 1, wherein the growth height of the junction region layer is at least 30 μm.

5. The vapor phase epitaxy method according to claim 1, wherein the doping over the junction region layer is changed over every 5 μm of growth height by at most $1 \cdot 10^{13}$ cm$^{-3}$.

6. The vapor phase epitaxy method according to claim 1, wherein the doping over the junction region layer is changed in at least four steps.

7. The vapor phase epitaxy method according to claim 1, wherein the element of main group III is gallium and the element of main group V is arsenic.

8. The vapor phase epitaxy method according to claim 1, wherein the third precursor is monosilane.

9. The vapor phase epitaxy method according to claim 1, wherein the first initial doping level is set starting from a second initial p-doping level by an abrupt change in the ratio of the first mass flow to the second mass flow.

10. The vapor phase epitaxy method according to claim 9, wherein the second initial p-doping level is at most $5 \cdot 10^{16}$ cm$^3$.

11. The vapor phase epitaxy method according to claim 9, wherein the second initial p-doping level is at most $1 \cdot 10^{16}$ cm$^{-3}$.

12. The vapor phase epitaxy method according to claim 1, wherein the doping of the III-V layer, preceding the first growth height is reduced by continuously and/or stepwise changing the ratio of the first mass flow to the second mass flow from a starting p-doping level of at least $5 \cdot 10^{16}$ cm$^{-3}$ to the first initial doping level or to a second initial p-doping level.

13. The vapor phase epitaxy method according to claim 1, wherein after the target n-doping level has been reached, growth is continued further over a growth height of at least 10 μm with the settings for the target n-doping level.

14. The vapor phase epitaxy method according to claim 1, wherein after the target n-doping level has been reached, a further target n-doping level is set by abruptly changing the third mass flow and/or by abruptly changing the ratio of the first mass flow to the second mass flow, wherein the second target n-doping level is greater than the target n-doping level.

15. The vapor phase epitaxy method according to claim 1, wherein the first initial doping level is an initial p-doping level and is at most $1 \cdot 10^{16}$ cm$^{-3}$.

16. The vapor phase epitaxy method according to claim 1, wherein the first initial doping level is an initial p-doping level and is at most $1 \cdot 10^{15}$ cm$^{-3}$.

17. The vapor phase epitaxy method according to claim 1, wherein the first initial doping level is an initial p-doping level and is at most $5 \cdot 10^{14}$ cm$^{-3}$.

18. The vapor phase epitaxy method according to claim 1, wherein the first initial doping level is an initial n-doping level and is at most $5 \cdot 10^{14}$ cm$^{-3}$.

19. The vapor phase epitaxy method according to claim 1, wherein the first initial doping level is an initial n-doping level and is at most $1 \cdot 10^{14}$ cm$^{-3}$.

20. The vapor phase epitaxy method according to claim 1, wherein the target n-doping level is at most $1 \cdot 10^{16}$ cm$^{-3}$.

21. The vapor phase epitaxy method according to claim 1, wherein the target n-doping level is at most $1 \cdot 10^{16}$ cm$^{-3}$.

22. The vapor phase epitaxy method according to claim 1, wherein the target n-doping level is at most $5 \cdot 10^{14}$ cm$^{-3}$.

23. The vapor phase epitaxy method according to claim 1, wherein a growth height of the junction region layer is at least 60 μm.

24. The vapor phase epitaxy method according to claim 1, wherein the doping of the III-V layer, preceding the first growth height is reduced by continuously and/or stepwise changing the ratio of the first mass flow to the second mass flow from a starting p-doping level of at least $1 \cdot 10^{17}$ cm$^{-3}$ to the first initial doping level or to a second initial p-doping level.

* * * * *